United States Patent
Lu et al.

(10) Patent No.: US 9,252,048 B2
(45) Date of Patent: Feb. 2, 2016

(54) METAL AND VIA DEFINITION SCHEME

(71) Applicant: Taiwan Semiconductor Manufacturing Company, Ltd., Hsin-Chu (TW)

(72) Inventors: Yen-Cheng Lu, New Taipei (TW); Chih-Tsung Shih, Hsin-Chu (TW); Shinn-Sheng Yu, Hsin-Chu (TW); Jeng-Horng Chen, Hsin-Chu (TW); Anthony Yen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 142 days.

(21) Appl. No.: 14/191,169

(22) Filed: Feb. 26, 2014

(65) Prior Publication Data
US 2015/0072519 A1  Mar. 12, 2015

Related U.S. Application Data

(63) Continuation-in-part of application No. 14/024,103, filed on Sep. 11, 2013.

(51) Int. Cl.
*H01L 21/76* (2006.01)
*H01L 21/768* (2006.01)

(52) U.S. Cl.
CPC ...... *H01L 21/76829* (2013.01); *H01L 21/7684* (2013.01); *H01L 21/76807* (2013.01); *H01L 21/76846* (2013.01)

(58) Field of Classification Search
CPC ............ H01L 21/7684; H01L 21/76877; H01L 21/76819; H01L 21/31053; H01L 21/76843; H01L 21/76808; H01L 21/76807; H01L 21/76813; H01L 21/31144; H01L 21/76811

USPC ................................. 438/626, 638
See application file for complete search history.

(56) References Cited

U.S. PATENT DOCUMENTS

| | | | |
|---|---|---|---|
| 5,230,772 A | | 7/1993 | Kadomura |
| 5,912,188 A | * | 6/1999 | Gardner ............ H01L 21/31116 257/E21.252 |
| 6,836,017 B2 | | 12/2004 | Ngo et al. |
| 7,906,252 B2 | | 3/2011 | Lee et al. |
| 8,415,089 B1 | | 4/2013 | Gupta et al. |
| 8,791,024 B1 | | 7/2014 | Lu et al. |
| 2006/0131756 A1 | | 6/2006 | Bae |
| 2009/0219496 A1 | | 9/2009 | Kamm et al. |
| 2010/0297851 A1 | | 11/2010 | Bae et al. |
| 2011/0159253 A1 | | 6/2011 | Kang et al. |

FOREIGN PATENT DOCUMENTS

| | | |
|---|---|---|
| KR | 1020040005483 | 1/2004 |
| KR | 1020040057579 | 7/2004 |

(Continued)

*Primary Examiner* — Monica D Harrison
(74) *Attorney, Agent, or Firm* — Slater & Matsil, L.L.P.

(57) ABSTRACT

A method includes defining a photoresist layer over a first dielectric layer. The first dielectric layer is disposed over an etch stop layer and the etch stop layer is disposed over a second dielectric layer. A spacer layer is formed over the photoresist and the first dielectric layer. The spacer layer has an opening that has a via width. The opening is disposed directly above a via location. A metal trench with a metal width is formed in the first dielectric layer. The metal width at the via location is greater than the via width. A via hole with the via width is formed at the via location in the second dielectric layer.

20 Claims, 8 Drawing Sheets

(56) References Cited

FOREIGN PATENT DOCUMENTS

| KR | 1020060083507 | 7/2006 |
| KR | 1020110101098 | 9/2011 |
| TW | 200734812 | 9/2007 |

\* cited by examiner

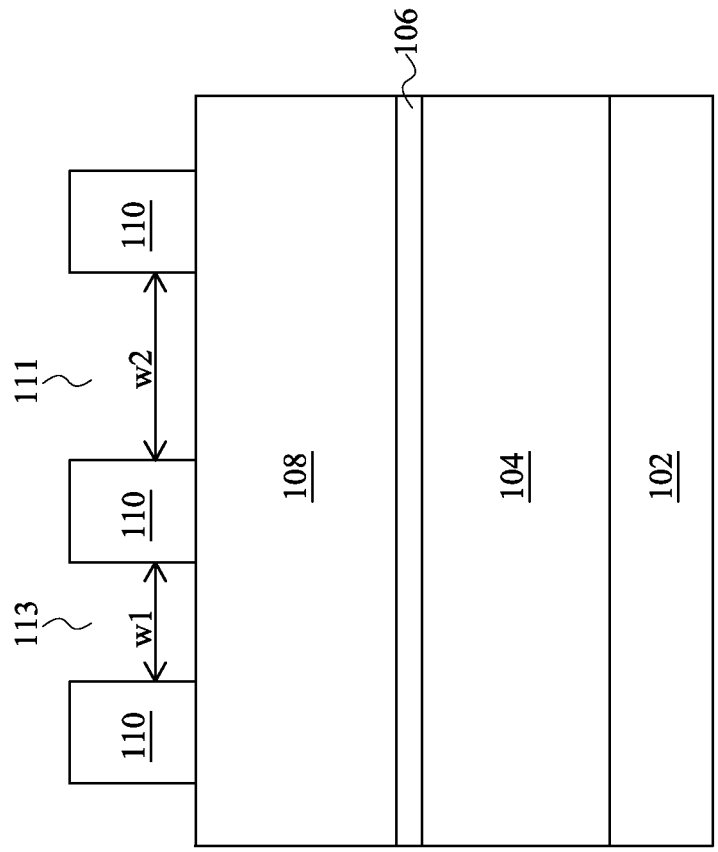
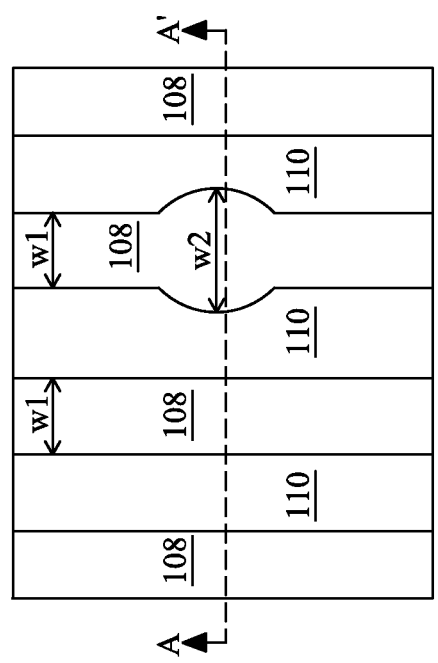
Fig. 1A
Fig. 1B

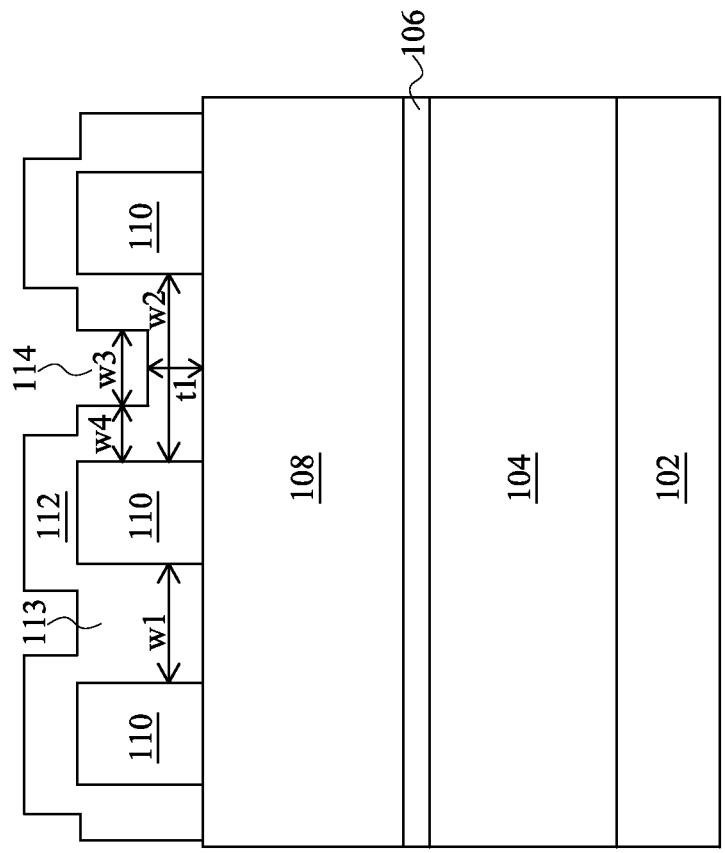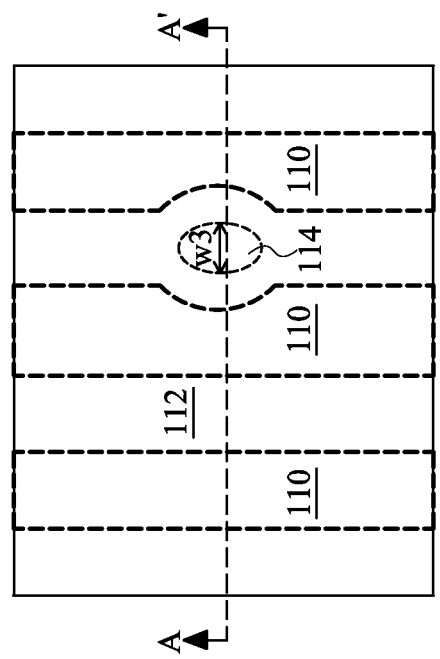
Fig. 2A
Fig. 2B

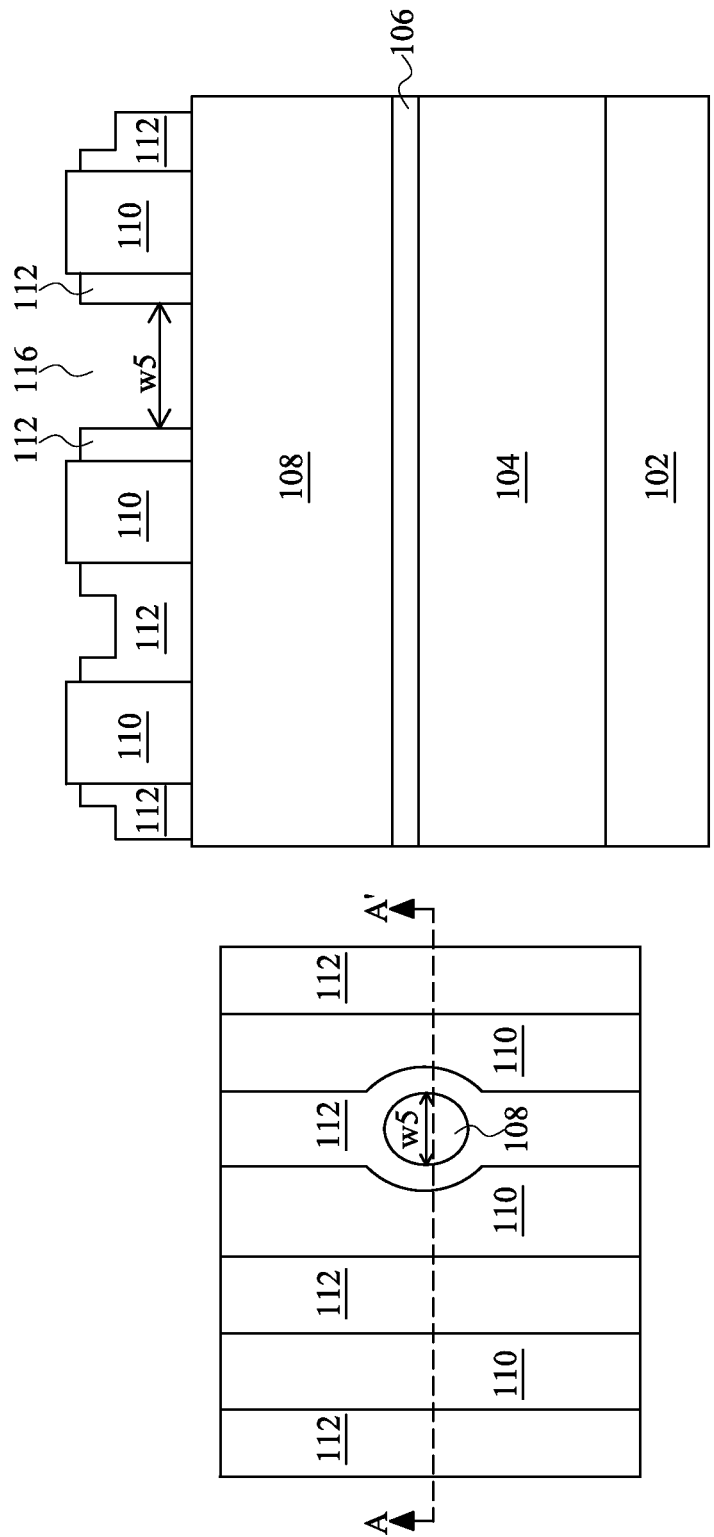

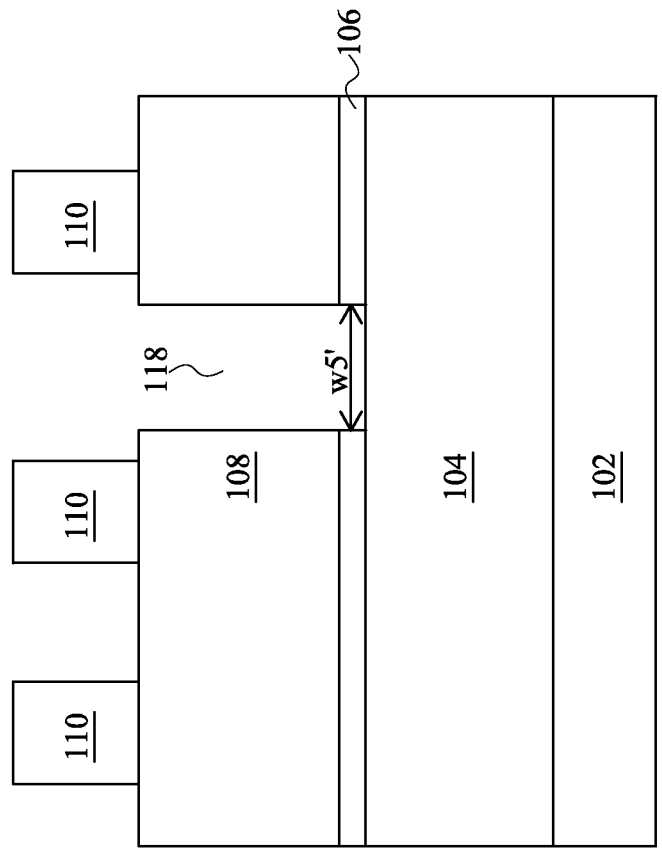
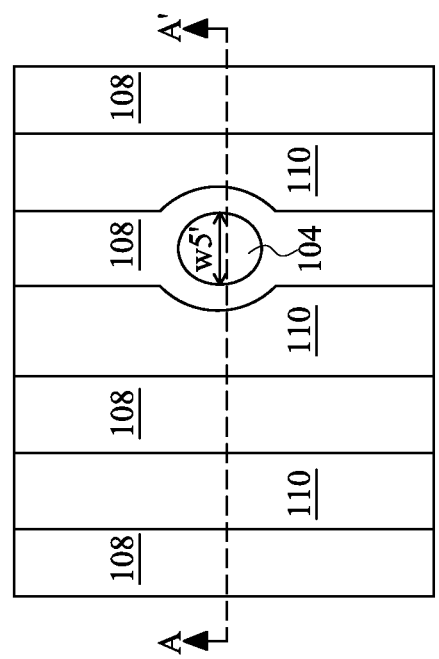
Fig. 5B
Fig. 5A

METAL AND VIA DEFINITION SCHEME

CROSS-REFERENCE TO RELATED APPLICATIONS

The present application is a continuation-in-part of U.S. patent application Ser. No. 14/024,103 filed on Sep. 11, 2013, which is entirely incorporated by reference herein. Also, the present application is related to U.S. patent application Ser. No. 13/906,795 filed on May 31, 2013, which claims priority of U.S. Provisional Patent Application Ser. No. 61/823,312 filed on May 14, 2013, both of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

BRIEF DESCRIPTION OF THE DRAWINGS

Reference is now made to the following descriptions taken in conjunction with the accompanying drawings, in which:

FIGS. 1A-8 are top views and cross sections of an integrated circuit structure illustrating intermediate fabrication steps of an exemplary metal and via definition scheme according to some embodiments.

DETAILED DESCRIPTION

Figures 4A, 4B:
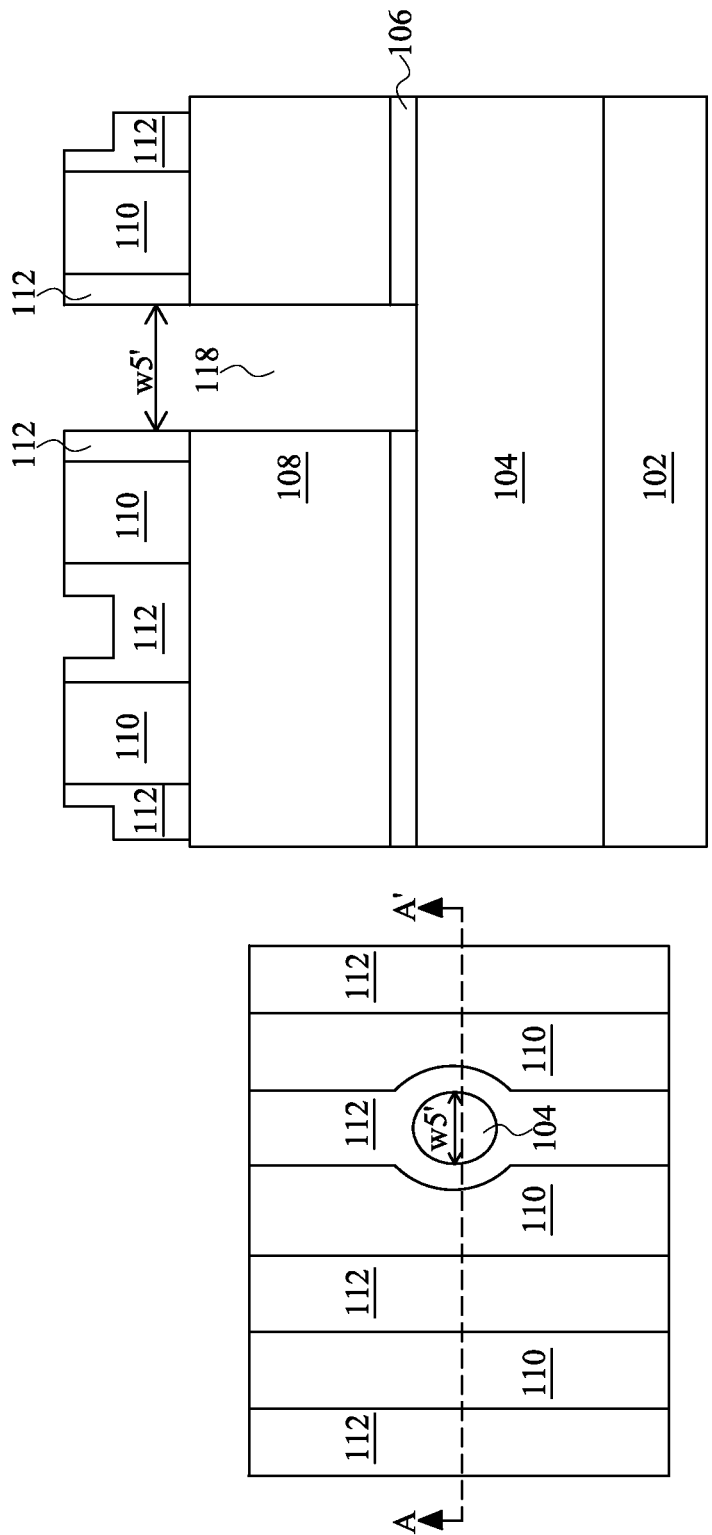

The making and using of various embodiments are discussed in detail below. It should be appreciated, however, that the present disclosure provides many applicable embodiments that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

ICs are commonly formed by a sequence of material layers, some of which are patterned by a photolithography process. It is important that the patterned layers properly align or overlay with adjacent layers. Proper alignment and overlay becomes more difficult in light of the decreasing geometry sizes of modern ICs. In addition, the surface topography of an underlying substrate, such as a semiconductor wafer, impacts the lithography imaging quality and further degrades the overlay tolerance between adjacent material layers. Furthermore, lithography processes are a significant contributor to the overall cost of manufacturing, including processing time and the cost of masks (also referred to as photomasks) used in the process. In some fabrication process, two different masks are used to define metal lines and vias with two separate exposure processes. More efficient and cost effective methods to define the metal layer and via layer are desirable.

FIG. 1A is a top view of an exemplary integrated circuit of the metal and via definition scheme at a metal pattern definition stage according to some embodiments. In FIG. 1A, a dielectric layer 108 and a photoresist layer 110 for defining metal pattern are shown.

The space between the photoresist layer 110 strips has a width w1 in an opening 113 that would not have a via directly underneath and a maximum width w2 in an opening 111 that would have a via to be formed directly underneath. The w1 ranges from about 40 nm to about 50 nm and the w2 ranges from about 60 nm to about 70 nm in some embodiments. The w2 is greater than the w1 from about 10% to about 50% in some embodiments. The opening 111 directly above the via to be formed with the maximum width w2 has a curved shape, such as a part of an oval or circular shape in some embodiments. However, other profile shapes are possible.

FIG. 1B is a cross section of the exemplary integrated circuit structure in FIG. 1A according to some embodiments. FIG. 1B illustrates the cross section along the cutline A-A' in FIG. 1A. In FIG. 1B, a substrate 102, dielectric layers 104 and 108, an etch stop layer 106, and a photoresist layer 110 for defining metal pattern are shown.

The substrate 102 comprises silicon, silicon dioxide, aluminum oxide, sapphire, germanium, gallium arsenide (GaAs), an alloy of silicon and germanium, indium phosphide (InP), silicon on insulator (SOI), or any other suitable material in some embodiments. The substrate 102 may also be made of or include some other suitable elementary semiconductor, such as diamond or germanium; a suitable compound semiconductor, such as silicon carbide, indium arsenide; or a suitable alloy semiconductor, such as silicon germanium carbide, gallium arsenic phosphide, or gallium indium phosphide. Alternatively, the substrate 102 may include a non-semiconductor material such as a glass substrate for thin-film-transistor liquid crystal display (TFT-LCD) devices, or fused quartz or calcium fluoride for a photomask (mask).

In some embodiments, the substrate 102 includes one or more material layers (e.g., insulating, conductive, semi-conductive, etc.) formed thereon. The substrate 102 may include various doped regions, dielectric features, and multilevel interconnects. The substrate 102 may further include additional features or layers with various devices and functional features. Active and passive devices, such as transistors, capacitors, resistors, and the like, may be formed on the substrate 102. In some embodiments, the substrate 102 includes various doped features for various microelectronic components, such as a complementary metal-oxide-semiconductor field-effect transistor (CMOSFET), an imaging sensor, and a memory cell.

The dielectric layers 104 and 108 may comprise low-k dielectric material, $SiO_2$, or other dielectric material. In some embodiments, each of the dielectric layers 104 and 108 has a thickness ranging from about 30 nm to about 100 nm. In some embodiments, low-k dielectric material (dielectric) has a dielectric constant less than about 3.5. In some embodiments, low-k dielectrics may also include a class of dielectrics referred to as extremely low-k (ELK) dielectrics, which have a dielectric constant less than about 2.5. For example, the extremely low-k dielectrics may be used as interlayer dielectrics (ILDs) for sub-micron technology (e.g., for 65 nm node, 45 nm node, or beyond technology). In addition, the extremely low-k dielectrics may be porous. In some embodiments, low-k dielectrics include oxygen, silicon, nitrogen, and the like. The exemplary ELK materials include carbon-containing materials, organo-silicate glass, porogen-containing materials, and the like. The dielectric layers 104 and 108 including low-k dielectrics may be deposited using spin-on or a CVD method such as Plasma Enhanced CVD (PECVD), Low Pressure CVD (LPCVD), or Atomic Layer CVD (ALCVD).

The etch stop layer 106 comprises tetraethyl orthosilicate (TEOS), SiO, SiC, SiN, SiOC, SiON, SiCN, $AlO_xN_y$, or any other suitable material in some embodiments. The etch stop layer 106 has a thickness ranging from about 2 nm to about 10 nm in some embodiments. The etch stop layer 106 can be formed over the dielectric layer 104 by PECVD or a physical vapor deposition (PVD) in some embodiments.

The photoresist layer 110 is defined (patterned) by a photolithography exposure using a mask. The photoresist layer 110 has a thickness ranging from about 70 nm to about 100 nm in some embodiments. In some embodiments, the opening 113 has an aspect ratio (i.e., height/width) ranging from about 1.4 to about 2.5 and the opening 111 has an aspect ratio ranging from about 1 to about 1.6. However, the aspect ratio of the openings 113 and 111 could be higher or lower in some embodiments.

FIG. 2A is the top view and FIG. 2B is the cross section of the exemplary integrated circuit structure in FIGS. 1A and 1B after a spacer layer 112 is deposited according to some embodiments. The spacer layer 112 is made of dielectric material, such as SiN. Also, any other suitable material can be used. The spacer layer 112, such as SiN, has a thickness ranging from about 20 nm to about 30 nm in some embodiments. The spacer layer 112 has a different etching characteristics from dielectric layer 108 and the etch stop layer 106, thus enabling a selective etching in some embodiments.

The spacer layer 112 is deposited by atomic layer deposition (ALD), CVD, or PECVD in some embodiments. The shape of the spacer layer 112 is generally conformal to the photoresist layer 110 and capable of gap filling the opening 113 in some embodiments. The spacer layer 112 is a dummy layer and would be removed later. The spacer layer 112 has a width w4 on the sidewall and a thickness t1 on the bottom of the opening 114 that range from about 20 nm to about 30 nm. The opening 113 is filled (or sealed) by the spacer layer 112. On the other hand, the opening 111 is partially filled to form a new opening 114 below the top surface of the photoresist 110. The opening 114 with a width w3 is formed on the top of the planned via area (e.g. the via hole 120 in FIG. 7). The opening 114 results from the photoresist layer 110 spacing of w2 that is greater than w1 by about 10%-about 50% in some embodiments.

FIG. 3A is the top view and FIG. 3B is the cross section of the exemplary integrated circuit structure in FIGS. 2A and 2B after the spacer layer 112 is etched to form the opening 116 with a spacing width w5 from the previous opening 114. The opening 116 is between the photoresist 110 strips and exposes the top surface of the dielectric layer 108. The width w5 is substantially close to the via width to be formed in the via hole 120 in FIG. 7 according to some embodiments.

A wet etching process is used for this operation in some embodiments. For example, the spacer layer 112 can be etched by hot $H_3PO_4$ solution (with the temperature ranging from about 80° C. to about 200° C.) from the top of the planned via region and extend into the opening 114 to reach the top surface of the dielectric layer 108 in FIG. 2B to closely match the planned via width. In one example, for a $H_3PO_4$ solution with about 85% concentration at about 165° C., the SiN etching rate is about 3 nm/min, and the etching depth can be controlled by etching time. The width w5 ranges from about 30 nm to about 50 nm in some embodiments. This operation is optional since the width w3 of the opening 114 in FIG. 2B could be suitable for the planned via width in some other embodiments.

Figure 7:
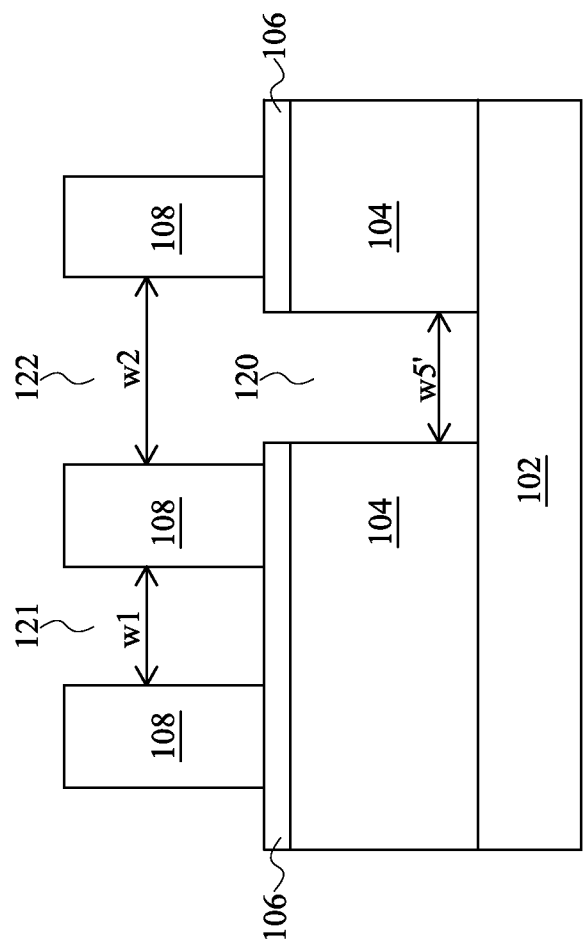

FIG. 4A is the top view and FIG. 4B is the cross section of the exemplary integrated circuit structure in FIGS. 3A and 3B after the dielectric layer 108 is etched to form the opening 118 that has a width w5' that matches the via width to be formed in the via hole 120 as shown in FIG. 7 according to some embodiments. The spacer layer 112 has a different etching selectivity from the dielectric layer 108, and functions as a self-aligning mask. The width w5' may be slightly different from the width w5 in FIG. 3B due to the additional etching. A dry etching process or any other suitable etching method is used for this step in some embodiments. For example, dry etching (plasma etching) using $C_2F_6$, $CF_4$, and/or oxygen as etchants can be performed to etch the dielectric layer 108. The dry etching stops at the etch stop layer 106.

The etch stop layer 106 can be etched by dry etching (plasma etching) using CxFy, $N_2$, and/or $O_2$ as etchants. Other suitable etching process can be used. In some embodiments, the dielectric layer 108 and the etch stop layer 106 are etched in one operation. Afterwards, the spacer layer 112 is removed.

FIG. 5A is the top view and FIG. 5B is the cross section of the exemplary integrated circuit structure in FIGS. 4A and 4B after the spacer layer 112 is removed according to some embodiments. A wet etching process is used for this operation in some embodiments, but dry etching can be used in other embodiments. For example, the spacer layer 112 can be removed by a hot $H_3PO_4$ solution with the temperature ranging from about 80° C. to about 200° C. Afterwards, the dielectric layers 104 and 108 are etched to form the metal trench 122 and the via hole 120 in FIGS. 6A and 6B.

Figures 6A, 6B:
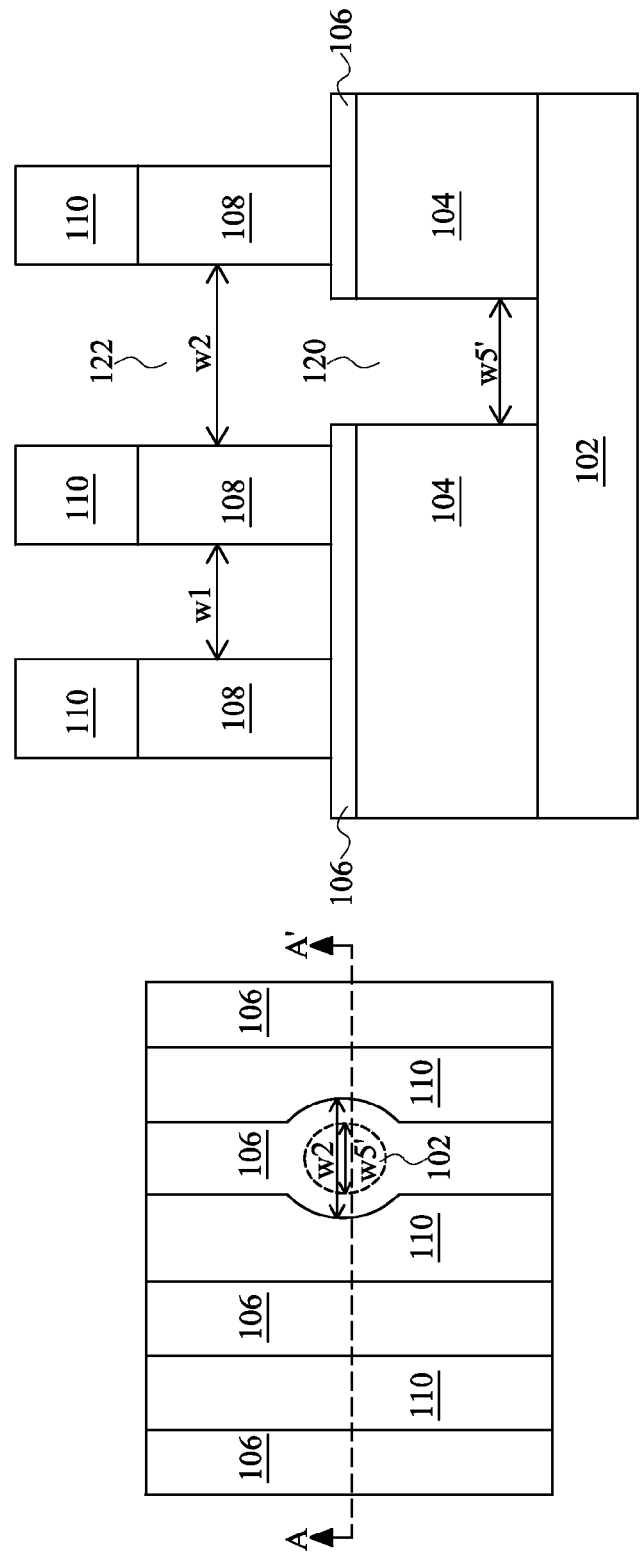

FIG. 6A is the top view and FIG. 6B is the cross section of the exemplary integrated circuit structure in FIGS. 5A and 5B after the dielectric layers 104 and 108 are etched to form the metal trench 122 and the via hole 120 according to some embodiments. A dry etching process or any other suitable etching method can be used for this operation. For example, dry etching (plasma etching) using $C_2F_6$, $CF_4$, and/or oxygen as etchants can be performed to etch the dielectric layers 104 and 108. Any other suitable etching process can be also used.

As described above, the via hole 120 can be defined by the use of the photoresist layer 110 using the metal trench pattern. This mechanism completes the metal and via definition by the same mask with a photolithography exposure of the photoresist layer 110 and using the spacer layer 112, compared to two exposures for a conventional dual damascene process. Two mask patterns used for the conventional process for forming metal lines and vias can be reduced to one mask to reduce costs. Using multiple masks incurs overlay errors and increase patterning variations. Reducing the patterning masks to one reduces overlay errors and improves patterning accuracy. Also, the process is simpler and more suited for manufacturing with reduced complexity.

FIG. 7 is the cross section of the exemplary integrated circuit structure in FIGS. 6A and 6B after the photoresist layer 110 is removed according to some embodiments. The photoresist layer 110 can be removed by any one of a dry etching process, such as plasma ashing ($O_2$ ash process), or other suitable methods.

Figure 8:
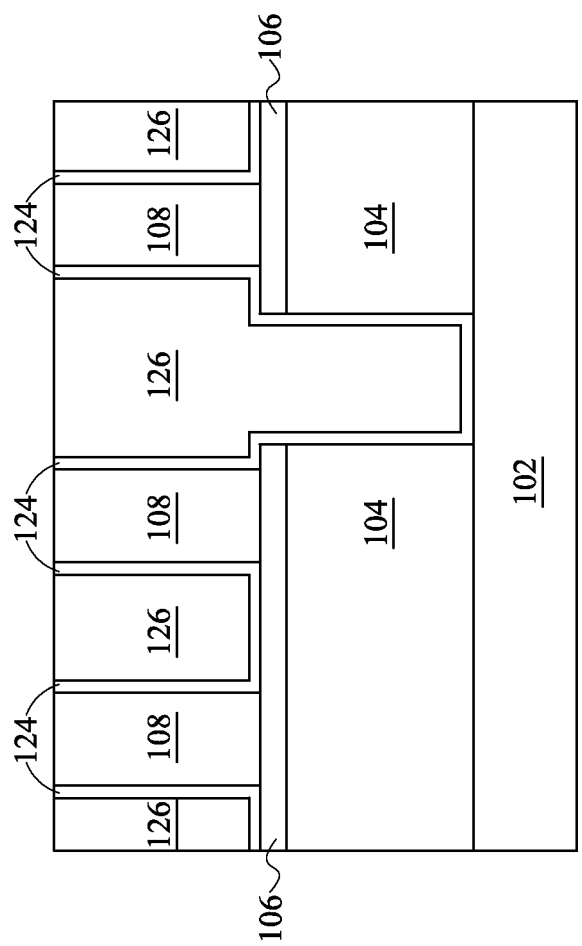

FIG. 8 is the cross section of the integrated circuit structure in FIG. 7 after a barrier layer 124 and a gap filling metal layer 126 are formed. In some embodiments, copper (Cu) is used as the conductive material to fill the trench 121 and 122 and the via hole 120. In some embodiments, the barrier layer 124, such as Ta, TaN, TiN, or any combination thereof, is formed on the trench 121 and 122 and the via hole 120 before filling in the trenches with the conductive material. The barrier layer 124 is deposited by a proper technique, such as ALD, PVD, or CVD. The barrier layer 124 may function as a diffusion barrier and adhesive layer for integrity of the interconnect structure.

Afterwards, the metal trench 121 and 122, and the via hole 120 are filled with metal, such as Cu, to form metal lines and a via, respectively. For example, Cu can be deposited using an electrochemical plating process. In some embodiments, a Cu seed layer is formed by PVD with a thickness ranging from about 2 nm to about 10 nm in the metal trench 122 and the via hole 120 prior to filling the metal trench 122 and the via hole 120. In some embodiments, a planarizing process such as a chemical mechanical polishing is performed after filling the metal trench 122 and the via hole 120 to remove excess conductive materials (e.g., a top part of the metal filled over the metal trenches 121 and 122).

By using the mechanism described above, a via of an interconnect structure can be defined by the use of a spacer layer according to the overlying metal trench pattern. This mechanism completes the via definition by a photolithography exposure of the photoresist using the mask of the metal trench pattern, and narrowing of the width of the opening of the metal trench pattern using the spacer layer. In comparison, a conventional dual damascene process requires two photomasks. Thus, two mask patterns used for the conventional process can be reduced to one mask, which reduces cost, overlay errors, and process complexity.

According to some embodiments, a method includes defining a photoresist layer over a first dielectric layer. The first dielectric layer is disposed over an etch stop layer and the etch stop layer is disposed over a second dielectric layer. A spacer layer is formed over the photoresist and the first dielectric layer. The spacer layer has an opening that has via width. The opening is disposed directly above a via location. A metal trench with a metal width is formed in the first dielectric layer. The metal width at the via location is greater than the via width. A via hole with the via width is formed at the via location in the second dielectric layer.

According to some embodiments, a method includes defining a photoresist layer over a first dielectric layer. The first dielectric layer is disposed over an etch stop layer and the etch stop layer is disposed over a second dielectric layer. A spacer layer is deposited over the photoresist layer and the first dielectric layer. The spacer layer is etched to form a first opening with the via width wherein the first opening is disposed directly above a via location. The first dielectric layer is etched to form a second opening with a width matching the via width at the via location. A metal trench with a metal width is formed in the first dielectric layer. The metal width at the via location is greater than the via width. A via hole with the via width is formed at the via location in the second dielectric layer.

According to some embodiments, a method includes defining a photoresist layer over a first dielectric layer. The first dielectric layer is disposed over an etch stop layer. The etch stop layer is disposed over a second dielectric layer. The first dielectric layer and the second dielectric layer comprise SiO2 or low-k dielectric material. A spacer layer is formed over the photoresist and the first dielectric layer. The spacer layer has a first opening that has a via width. The first opening is disposed directly above a via location. The spacer layer comprises SiN. The first dielectric layer is etched to form a second opening matching the via width at the via location. The spacer layer is removed after etching the first dielectric layer. A metal trench with a metal width is formed in the first dielectric layer. The metal width at the via location is greater than the via width. A via hole with the via width is formed at the via location in the second dielectric layer. The photoresist layer is removed.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
   defining a photoresist layer over a first dielectric layer, wherein the first dielectric layer is disposed over an etch stop layer and the etch stop layer is disposed over a second dielectric layer;
   forming a spacer layer over the photoresist and the first dielectric layer, wherein the spacer layer has a first opening that has a via width and the first opening is disposed directly above a via location;
   forming a metal trench with a metal width in the first dielectric layer, wherein the metal width at the via location is greater than the via width; and
   forming a via hole with the via width at the via location in the second dielectric layer.

2. The method of claim 1, wherein forming the spacer layer comprises depositing the spacer layer over the photoresist layer and the first dielectric layer by an atomic layer deposition (ALD).

3. The method of claim 2, wherein forming the spacer layer further comprises etching the spacer layer to form the first opening with the via width.

4. The method of claim 1, wherein each of the first dielectric layer and the second dielectric layer comprise low-k dielectric material or $SiO_2$.

5. The method of claim 1, wherein the spacer layer is generally conformal and gap filling.

6. The method of claim 1, wherein defining the photoresist comprises forming a second opening in the photoresist layer directly above the via location and the second opening has an aspect ratio ranging from about 1 to about 1.6.

7. The method of claim 6, wherein defining the photoresist further comprises forming a third opening in the photoresist layer not directly above the via location and the third opening has an aspect ratio ranging from about 1.4 to about 2.5.

8. The method of claim 1, wherein the metal width at the via location is greater than the metal width away from the via location from about 10% to about 50%.

9. The method of claim 1, further comprising etching the first dielectric layer to form a second opening having a width matching the via width at the via location.

10. The method of claim 9, further comprising removing the spacer layer after etching the first dielectric layer.

11. The method of claim 10, wherein removing the spacer layer is performed by a wet etching process using a $H_3PO_4$ solution at about 165° C.

12. The method of claim 10, further comprising removing the photoresist layer after removing the spacer layer.

13. The method of claim 1, further comprising:
forming a barrier layer in the metal trench and the via hole, wherein the barrier layer comprises Ta, TaN, TiN, or any combination thereof;
forming a seed layer over the barrier layer;
filling a metal layer in the metal trench and the via hole; and
performing a planarizing process to remove a portion of the metal layer.

14. The method of claim 1, wherein a dry etching or a plasma etching process is used to form the metal trench and the via hole.

15. A method, comprising:
defining a photoresist layer over a first dielectric layer, wherein the first dielectric layer is disposed over an etch stop layer and the etch stop layer is disposed over a second dielectric layer;
depositing a spacer layer over the photoresist layer and the first dielectric layer; and
etching the spacer layer to form a first opening with a via width wherein the first opening is disposed directly above a via location;
etching the first dielectric layer to form a second opening with a width matching the via width at the via location;
forming a metal trench with a metal width in the first dielectric layer, wherein the metal width at the via location is greater than the via width; and
forming a via hole with the via width at the via location in the second dielectric layer.

16. The method of claim 15, wherein the spacer layer is deposited by an atomic layer deposition (ALD) process and the spacer layer is generally conformal and gap filling.

17. The method of claim 15, wherein each of the first dielectric layer and the second dielectric layer comprise low-k dielectric material or $SiO_2$.

18. The method of claim 15, wherein defining the photoresist comprises forming a second opening in the photoresist layer directly above the via location and the second opening has an aspect ratio ranging from about 1 to about 1.6.

19. The method of claim 15, further comprising removing the photoresist layer by $O_2$ ash process.

20. A method, comprising:
defining a photoresist layer over a first dielectric layer, wherein the first dielectric layer is disposed over an etch stop layer, the etch stop layer is disposed over a second dielectric layer, and the first dielectric layer and the second dielectric layer comprise low-k dielectric material or $SiO_2$;
forming a spacer layer over the photoresist and the first dielectric layer, wherein the spacer layer has a first opening that has a via width, the first opening is disposed directly above a via location, and the spacer layer comprises SiN;
etching the first dielectric layer to form a second opening with a width matching the via width at the via location;
removing the spacer layer after etching the first dielectric layer;
forming a metal trench with a metal width in the first dielectric layer, wherein the metal width at the via location is greater than the via width;
forming a via hole with the via width at the via location in the second dielectric layer; and
removing the photoresist layer.

* * * * *